US010243558B2

(12) United States Patent
Ryu et al.

(10) Patent No.: US 10,243,558 B2
(45) Date of Patent: Mar. 26, 2019

(54) COMPLEMENTARY METAL-OXIDE-SEMICONDUCTOR (CMOS) INVERTER CIRCUIT DEVICE

(71) Applicant: MagnaChip Semiconductor, Ltd., Cheongju-si (KR)

(72) Inventors: Beom Seon Ryu, Cheongju-si (KR); Gyu Ho Lim, Cheongju-si (KR); Tae Kyoung Kang, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/398,318

(22) Filed: Jan. 4, 2017

(65) Prior Publication Data

US 2017/0117894 A1  Apr. 27, 2017

Related U.S. Application Data

(63) Continuation-in-part of application No. 14/458,628, filed on Aug. 13, 2014, now abandoned.

(30) Foreign Application Priority Data

Oct. 18, 2013  (KR) .................. 10-2013-0124890

(51) Int. Cl.
*H03K 3/00* (2006.01)
*H03K 19/00* (2006.01)
*H03K 19/003* (2006.01)
*H03K 19/0948* (2006.01)

(52) U.S. Cl.
CPC ... *H03K 19/0013* (2013.01); *H03K 19/00315* (2013.01); *H03K 19/00323* (2013.01); *H03K 19/0948* (2013.01)

(58) Field of Classification Search
None
See application file for complete search history.

(56) References Cited

U.S. PATENT DOCUMENTS

| 6,198,334 | B1 * | 3/2001 | Tomobe | H03K 5/1252 327/112 |
| 6,686,773 | B1 | 2/2004 | Dash et al. | |
| 7,109,758 | B2 * | 9/2006 | Lin | H03K 19/0013 326/112 |
| 2005/0168250 | A1 * | 8/2005 | Lin | H03K 19/0013 327/112 |
| 2009/0219053 | A1 * | 9/2009 | Masleid | H03K 17/005 326/113 |

FOREIGN PATENT DOCUMENTS

| CN | 1681208 A | 10/2005 |
| CN | 102394635 A | 3/2012 |

* cited by examiner

*Primary Examiner* — Long Nguyen
(74) *Attorney, Agent, or Firm* — NSIP Law

(57) ABSTRACT

There is provided a CMOS inverter circuit device. The CMOS inverter circuit device includes a delay circuit unit configured to generate different charge and discharge paths of each gate node of a PMOS transistor and an NMOS transistor respectively at the time that an input signal transitions between high and low levels. Therefore, the present examples minimize or erase generation of a short circuit current made at the time that the input signal transition. The examples may simplify circuit architecture, and may make a magnitude of a CMOS inverter circuit device smaller.

14 Claims, 5 Drawing Sheets

COMPLEMENTARY METAL-OXIDE-SEMICONDUCTOR (CMOS) INVERTER CIRCUIT DEVICE

CROSS-REFENCE TO RELATED APPLICATIONS

This application is a continuation-in-part of application Ser. No. 14/458,628 filed on Aug. 13, 2014, which claims the benefit under 35 U.S.C. § 119(a) of Korean Patent Application No. 10-2013-0124890 filed on Oct. 18, 2013, in the Korean Intellectual Property Office, the entire disclosure of which is incorporated herein by reference for all purposes.

BACKGROUND

1. Field

The following description relates to a CMOS inverter circuit device. The following description also relates to a CMOS inverter circuit device that makes a circuit constitution simpler and also prevents generation of a short circuit current by simultaneously turning-off a P-type metal-oxide-semiconductor (PMOS) and an N-type metal-oxide-semiconductor (NMOS) included an output terminal of the CMOS inverter, when an input signal transitions. PMOS and NMOS are used herein to refer to types of transistor.

2. Description of Related Art

Consumption of power has become an important factor limiting a performance of a chip, such as a processor. As a clock speed and a degree of complexity of the chip increase by the development of semiconductor techniques, power demands grow. Therefore, precisely estimating power consumption of the CMOS inverter when designing a semiconductor directly leads to an increased assurance for reliability of the chip and a reduction of design time.

Meanwhile, for a highly complex semiconductor circuit that has a long signal delivery path, operability of a final output terminal of the circuit is enhanced by including a stepped buffer at a signal delivery path and considering the operability at the final output terminal. For enhancing the operability in this context, generally, a buffer is configured as being stepped by connecting CMOS inverter circuits.

However, using the CMOS inverter configuring buffer leads to an issue that a short circuit current is generated when an input signal transitions. That is, a short circuit current is generated when the input level of the input signal changes from a high level to a low level or from a low level to a high level at an input terminal. The short circuit current refers to the phenomenon that a current flows between a power supply terminal and a ground, as a PMOS and an NMOS configured at an output terminal of the CMOS are simultaneously switched on while the input signal transitions as above.

When the short circuit current is generated as described above, the power consumption is unnecessarily increased. The power consumed by such short circuit currents usually does not account for a large part of overall power consumption. However, in situations where the problem of reducing of power efficiency is relevant, such cases frequently happen in which the power used by the short circuit current consumes 20% or more of overall power consumption. In these situations, the power consumption resulting from the short circuit current is more significant and is not negligible.

Further, the short circuit current becomes abnormally high when it operates at the time that the PMOS and NMOS are switched off. Thus, some or all of the circuit elements subjected to the short circuit current might be destroyed or damaged physically. As a result, an output signal that is output from the output terminal of CMOS may not be output stably. In this respect, methods for minimizing the short circuit current at a CMOS inverter would avoid some of these issues.

In an example, an approach to minimize short circuit current is disclosed, in which the short circuit current is minimized by simultaneously turning the PMOS and NMOS located at an output terminal off, the moment an input signal transitions.

However, in such an example, when an input signal transitions from a low level to a high level, a gate node of an NMOS is discharged through a transistor M4, and then, a gate node of a PMOS is discharged through a transistor M5 and transistor M4. At this time, the gate node of the PMOS has a feedback loop value which is fed back with a signal from the gate node of the NMOS.

By contrast, when an input signal transitions from a high level to a low level, a gate node of the PMOS is charged through a transistor M2 and a node is discharged as a transistor M3 is turned on, and accordingly, a transistor M6 is turned on. Therefore, a gate node of the NMOS is charged through paths of the transistors M6 and M2. However, even in this case, the gate node of the NMOS has a feedback loop that is fed back with a signal from the gate node of PMOS.

Pursuant to the said example, the example may also be configured to minimize the short circuit current.

Nevertheless, as described so far, the example is configured to require receiving a feedback signal from an opposite node in order for the PMOS 580 and NMOS 590 to be simultaneously off. Therefore, charge and discharge paths have no alternative but to be long due to the receipt issue.

This situation brings about a problem that a working speed of the CMOS inverter reduces. That is, although this example has the characteristic of minimizing the short circuit current, it also has the characteristic that its working speed is reduced due to the use of long charge/discharge paths. Further, power consumption is increasingly generated due to the feedback loop.

Moreover, the example has the characteristic of using a feedback loop. Thus, issues of circuit design becoming more complicated caused by including such a feedback loop and an increase in overall size of such a processor would be associated with such an example.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An objective of the present examples is to address the described issues. For example, the present examples provide a CMOS inverter circuit device that minimizes a short circuit current which is generated at the time of transiting of an input signal, while also using simplified circuit architecture.

Another objective of the present examples is to provide an optimized CMOS inverter circuit device by making timing, in which the PMOS and NMOS are to be off, controllable, while also considering a working speed and power consumption according to an intended use of CMOS inverter circuit device.

In one general aspect, a CMOS inverter circuit device includes a first P-type metal-oxide-semiconductor (PMOS)

transistor and a first N-type metal-oxide-semiconductor (NMOS) transistor, and a second PMOS transistor and a second NMOS transistor configured to each receive an identical input signal through a gate terminal, and be connected in series respectively, a third PMOS transistor connected to a first node connected with drains of the first PMOS transistor and the first NMOS transistor, a third NMOS transistor connected to a second node connected with drains of the second PMOS transistor and the second NMOS transistor, and a delay circuit unit comprising a fourth PMOS transistor and a fourth NMOS transistor configured to each receive the input signal through a respective gate, and be connected in series in order for a fifth node connected with drains of the fourth PMOS transistor and the fourth NMOS transistor to be connected to a fourth node connected with a source of the first NMOS transistor and a source of the second PMOS transistor.

The sources of the third PMOS transistor, first PMOS transistor and fourth PMOS transistor may be connected to a power supply terminal, and the sources of the third NMOS transistor, second NMOS transistor, and fourth NOMS transistor may be connected to a ground terminal.

A discharge path through the second NMOS transistor and a discharge path through the first NMOS transistor and fourth NMOS transistor may be generated when the input signal is at a high level.

The second node may discharged and the first node may be discharged.

The third PMOS transistor and third NMOS transistor may be maintained in a turned-off state until the second node is discharged and the first node is discharged.

A charge path through the first PMOS transistor and a charge path through the fourth PMOS transistor and second PMOS transistor may be generated when the input signal is at a low level.

The first node may be charged and the second node may be charged.

The third PMOS transistor and third NMOS transistor may be maintained in a turned-off condition until the first node is charged and the second node is charged.

The fourth PMOS transistor and fourth NMOS transistor of the delay unit circuit may include a connected a fifth PMOS transistor and a connected a fifth NMOS transistor connected in series.

Channel lengths of the fifth PMOS and fifth NMOS may be the same as those of the fourth PMOS transistor and fourth NMOS transistor.

The channel lengths of the fifth PMOS and fifth NMOS may be different from those of the fourth PMOS transistor and fourth NMOS transistor.

Times of charging and discharging may be controlled based on the number of the PMOS transistors and NMOS transistors of the delay unit circuit.

In another general aspect, a CMOS inverter circuit device includes a first P-type metal-oxide-semiconductor (PMOS) transistor and a first N-type metal-oxide-semiconductor (NMOS) transistor, and a second PMOS transistor and a second NMOS transistor configured to each receive an identical input signal through a gate terminal, and be connected in series respectively, a third PMOS transistor connected to a first node connected with drains of the first PMOS transistor and the first NMOS transistor, a third NMOS transistor connected to a second node connected with drains of the second PMOS transistor and the second NMOS transistor, and a delay circuit unit comprising delay PMOS transistors and delay NMOS transistors configured to each receive the input signal through a respective gate, and be connected in series in order for a fifth node connected with drains of the delay PMOS transistors and the delay NMOS transistors to be connected to a node connected with a source of the first NMOS transistor and a source of the second PMOS transistor.

Times of charging and discharging may be controlled based on the number of the delay PMOS transistors and delay NMOS transistors of the delay unit circuit.

Figure 1:
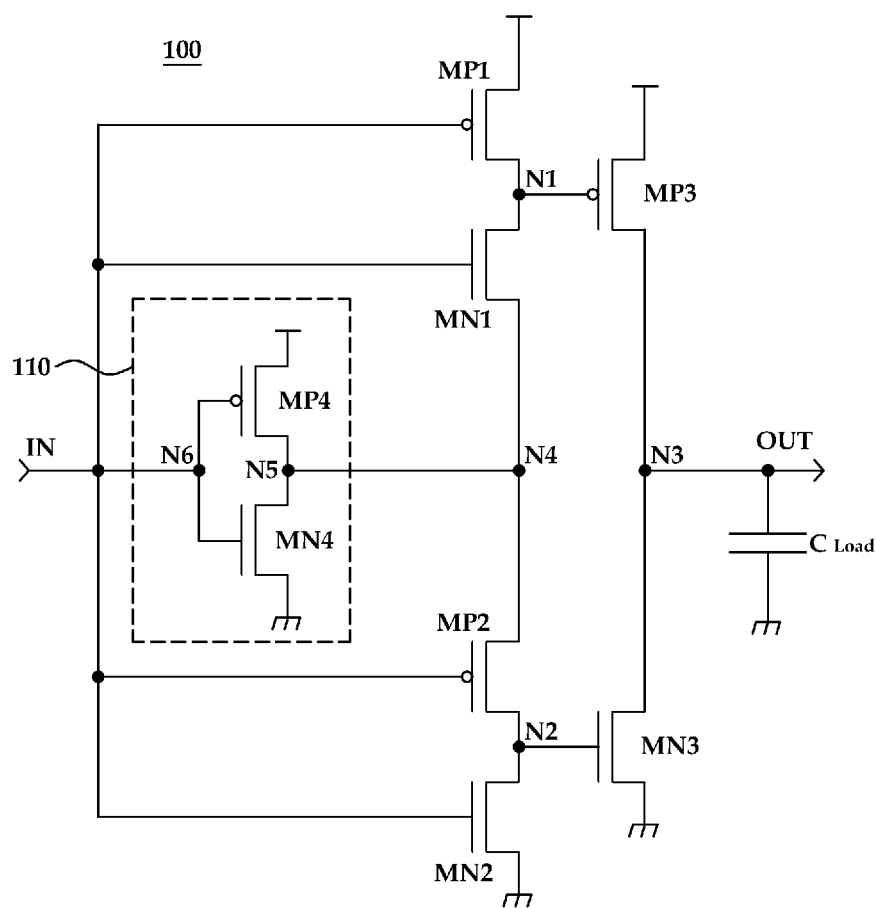
FIG. 1 is a schematic diagram illustrating a CMOS inverter circuit device according to a first example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. These terms do not necessarily imply a specific order or arrangement of the elements, components, regions, layers and/or sections. Thus, a first element, component, region, layer or section discussed below could be termed a second element, component, region, layer or section without departing from the teachings description of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Effects obtained from the CMOS inverter circuit device of the present examples are described as below.

That is, the present examples further provide a delay circuit unit individually generating a charge path and a discharge path of each gate node of an MP3 and MN3 respectively, when an input signal transitions.

Therefore, when the input signal transitions, a node from each gate node of the PMOS MP3 and the NMOS MN3 is firstly charged or discharged and another node is charged or discharged after a certain time interval t1 and t2 passes, thus, the PMOS MP3 and the NMOS MN3 may be turned-off simultaneously during the time intervals between t1 and t2.

By using this approach, the effect of minimizing or reducing a short circuit current generated at the CMOS inverter at the time of transitioning of an input signal is provided.

Further, the present examples are capable of providing a simpler circuit architecture by comparison with a conventional circuit architecture that is used to reduce a short circuit current. In examples, a delay circuit unit only includes a PMOS and an NMOS only. Thus, a size of circuit in examples may also be smaller than the size of circuits in other approaches.

Also, the present examples are capable of effectively preventing or minimizing generation of a short circuit current effectively. This goal is accomplished because the times t1 and t2 vary in which the gate nodes of PMOS MP3 and NMOS MN3 are charged and discharged, when the PMOS and NMOS are added at the delay circuit unit.

The examples provided are basically characterized by removing a short current generated at the time of transitioning of an input signal by charging and discharging a PMOS and an NMOS of an output terminal according to a delay time, the moment an input signal of a CMOS inverter transitions. That is, an example prevents a PMOS and an NMOS being simultaneously turned-on, when an input signal transitions.

The examples regarding the CMOS inverter circuit device providing these characteristics according to the present description are described with reference to the accompanying drawings.

FIG. 1 illustrates a schematic diagram explaining a CMOS inverter circuit device according to the example 1 of the present disclosure.

As illustrated in FIG. 1, when considering the architecture of CMOS inverter circuit device 100, a PMOS MP1 and an NMOS MN1 are connected in series. A source of the PMOS MP1 is connected to a power supply voltage terminal. Additionally, a PMOS MP2 and an NMOS MN2 are connected each other in series. A source of the MNOS MN1 is grounded. In the example of FIG. 1, gates of the PMOS MP1, NMOS MN1, PMOS MP2 and NMOS MN2 are configured to receive identical signals from the input terminal (IN). The channel lengths of the MN1, MN2, MP1 and MP2 are identical. Depending on the configuration of the architecture of CMOS inverter circuit device 100, the bodies of the PMOS MP1, NMOS MN1, PMOS MP2 and NMOS MN2 are connected to a source voltage terminal or a source voltage of a connecting transistor. For example, the body of MP2 is connected to the source of MN1 through node N4.

Additionally, a node N1 is formed at a point where a drain of PMOS MP1 and a drain of an NMOS MN1 are connected to each other. Also, a node N2 is formed at a point where a drain of PMOS MP2 and a drain of an NMOS MN2 are connected to each other.

The node N1 is connected with a gate of PMOS MP3, and the source of PMOS MP3 is connected to a source voltage terminal, therein. The node N2 is connected with a gate of an NMOS MN3, and the source of NMOS MN3 is grounded. Also, a node N3 is formed at a point where a drain of PMOS MP3 and a drain of an NMOS MN3 are connected. Here, channel lengths of the NMOS MN3 and PMOS MP3 are identical to the channel lengths for the existing NMOS (MN1, MN2) and PMOS (MP1, MP2). Meanwhile the node N3 is connected with an output capacitor $C_{LOAD}$ in a row. Here, the output capacitor $C_{LOAD}$ in intended to be a relatively big capacitor, i.e., a heavy capacitor with a great capacitance. Thus, a large short circuit current is generated at the inverter circuit in order to drive a large load.

Meanwhile, a node N4 is formed at a point where a source of the NMOS MN1 and a source of the PMOS MP2 are connected. The node N4 is connected with a delay circuit unit 110.

The delay circuit unit 110 includes a PMOS MP4 and an NMOS MN4 connected in series. Also, a source of the PMOS MP4 is connected to a power supply voltage terminal, and a source of the NMOS MN4 is grounded.

Also, the delay circuit unit 110 provides an architecture for connecting the node N4 with the input terminal (IN). For instance, a node N5 is formed at a point where a drain of PMOS MP4 and a drain of an NMOS MN4 are connected, and a node N6 is formed at a point where a gate of PMOS MP4 and a gate of an NMOS MN4 are connected. The node N5 is connected to the node N4, and the node N6 receives an input signal by being connected with an input terminal. Here, channel lengths of the NMOS MN4 and the PMOS MP4 may be identical to the channel lengths for the existing NMOS (MN1, MN2, MN3) and PMOS (MP1, MP2, MP3). In other case, channel lengths of the NMOS MN4 and the PMOS MP4 may be greater than those of the existing NMOS (MN1, MN2, MN3) and PMOS (MP1, MP2, MP3).

If a CMOS inverter circuit device 100 is configured as described above, two paths of each of the charge and discharge are generated, respectively. Therefore, in such an example, it is prevented that the PMOS MP3 and NMOS MN3 are simultaneously turned-on. Accordingly, by avoiding the scenario where the PMOS MP3 and NMOS MN3 are simultaneously turned-on, the example minimizes the short circuit current generated between a power supply voltage terminal and a grounding terminal.

Figure 2:
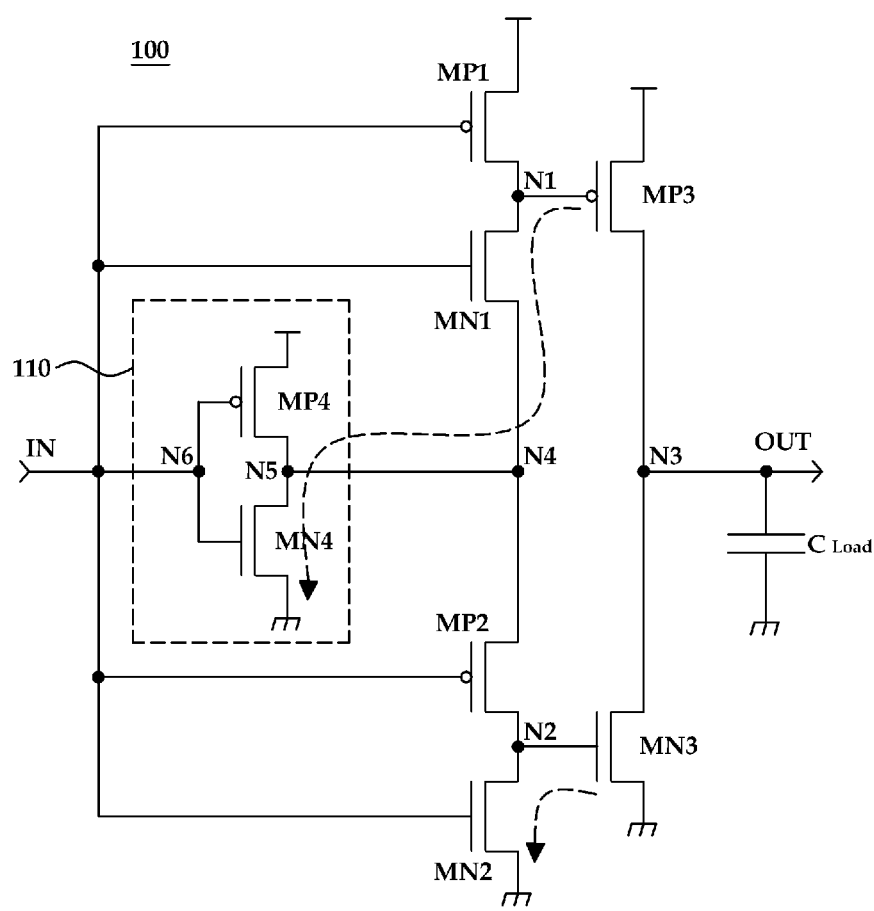
FIGS. 2 and 3 are schematic diagrams illustrating charge/discharge paths of the CMOS inverter circuit device illustrated in FIG. 1.
Figure 3:
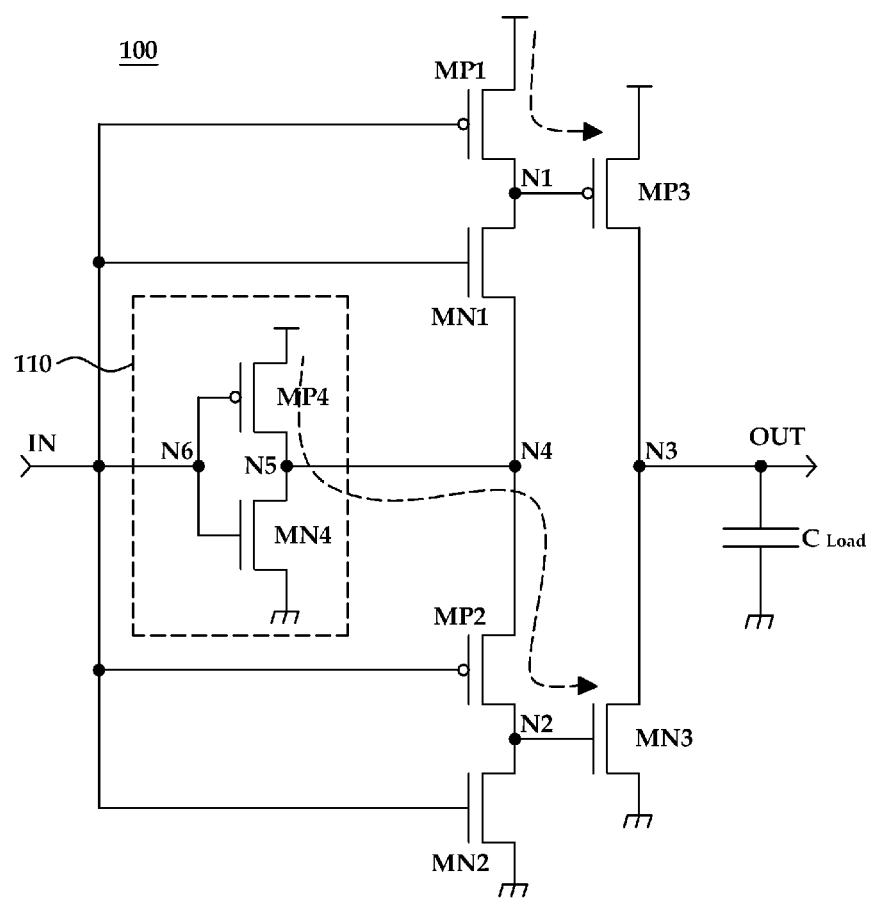
Figure 4:
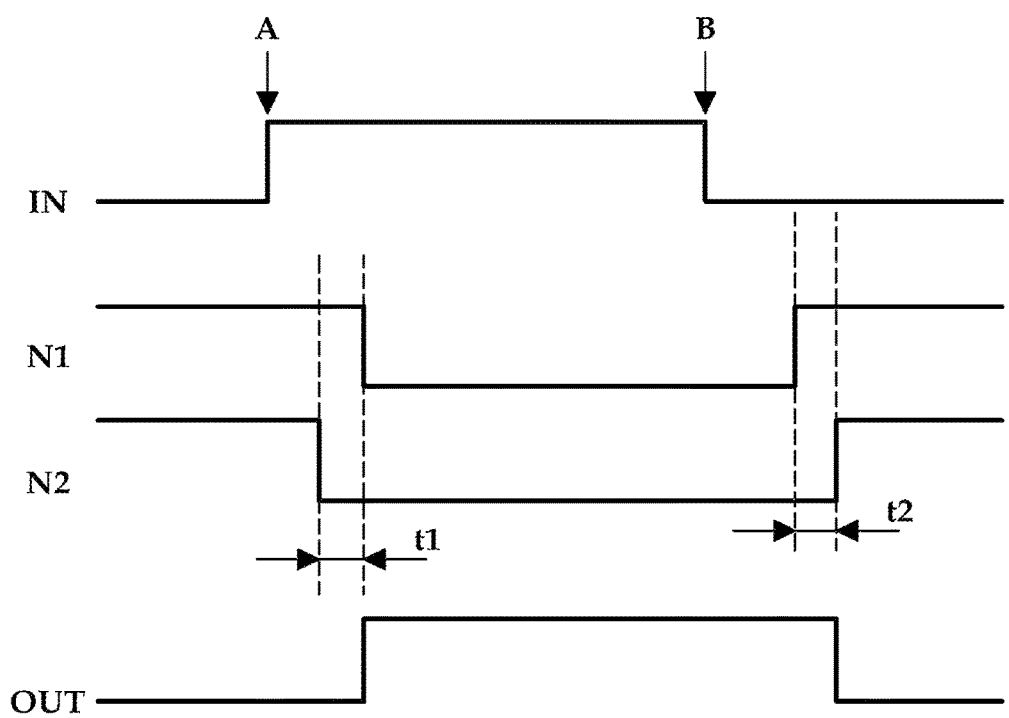
FIG. 4 is a diagram of an operation timing of the CMOS inverter circuit device illustrated in FIG. 1.

An operational status in which the generation of the short circuit current is minimized as above is described further in reference to FIGS. 2 to 4. For example, FIGS. 2 and 3 are schematic diagrams illustrating charge/discharge paths of the CMOS inverter circuit device illustrated in FIG. 1. FIG. 4 is a diagram of an operation timing of the CMOS inverter circuit device illustrated in FIG. 1.

As an initial example, a case is described in which an input signal transitions from a low level to a high level. When the input signal transitions to a high level, the input signal is transferred to the NMOS MN2, NMOS MN1 and NMOS MN4.

Accordingly, the NMOS MN2 is operated in a turned-on state and the node N2 is discharged to a grounding terminal. At the same time, the NMOS MN1 and NMOS MN4 are operated in a turned-on state and the node N1 is discharged to a grounding terminal. The said two discharge paths are illustrated in FIG. 2.

In this example approach, illustrated in FIG. 2, the node N2 is initially discharged and the node N1 is discharged subsequently. That is, when discharged, the node N1 performs a discharge through a discharge path formed by operating in a turned-on mode of the NMOS MN1 and NMOS MN4. In this example, when discharged, the node N2 is performs a discharge through a discharge path formed by only operating in a turned-on mode of the NMOS MN2.

Thus, as illustrated in FIG. 4, when considering the node N1 and node N2 after the point A at which an input signal transitions from a low level to a high level, the node N2 initially becomes low and the node N1 becomes low after a time t1 passes.

Therefore, the PMOS MP3 and NMOS MN3 of the output terminal are simultaneously turned-off for the transitional period of time t1. For that reason, a short circuit current is not generated for the time period t1 during which the input signal transitions from a low level to a high level.

Next, a complementary case is described, in which an input signal transitions from a high level to a low level. When the input signal transitions to a low level, the input signal is transferred to the PMOS MP1, PMOS MP4 and PMOS MP2.

Accordingly, the PMOS MP1 is turned-on and thus the node N1 performs a charge operation. At the same time, the PMOS MP4 and PMOS MP2 are simultaneously turned-on and the node N2 is performs a charge operation accordingly. The said two charge paths are illustrated in FIG. 3.

In this example, the node N1 is initially charged and the node N2 is charged subsequently during the charging process. That is, the node N1 is charged through a charge path formed by operating in a turned-on mode of the PMOS MP1, and the node N2 is charged through a charge path formed by operating in a turned-on mode of the PMOS MP4 and PMOS MP2.

Thus, as illustrated in FIG. 4, when considering the node N1 and node N2 after the point B at which an input signal transitions from a high level to a low level, the node N1 initially becomes high and the node N2 becomes high after time t2 passes.

Therefore, the PMOS MP3 and NMOS MN3 of the output terminal are simultaneously turned-off for the transitional period of time t2. For that reason, a short circuit current is not generated for the time period t2 during which the input signal transitions from a high level to a low level.

When looking into the examples provided as above, each different path of charging and discharging is provided during operating a charging and a discharging of the nodes N1 and N2. Accordingly, the PMOS MP3 and NMOS MN3 of the output terminal do not become turned-on simultaneously. As a result of this approach, the nodes N1 and N2 are charged and discharged independently without any relation to each other when the input signals are transferred.

Meanwhile, a delay circuit unit 110 is added in the above example of the present disclosure. Thus, a time delay is provided between when the node N1 and the node N2 charge or discharge. That is, the node N1 is discharged by passing through all the NMOS MN1 and NMOS MN4 and the node N2 is discharged by passing through the NMOS MN2. Therefore, substantially, a representative equation of the discharge times of N1 and N2 is defined as N1:N2=2:1. In other words, this equation means that a maintenance time in which the PMOS MP3 and NMOS MN3 of the output terminal are turned-off is controllable, because it is possible to stagger the charge and discharge times.

Therefore, the present examples are configured to control the number of the PMOS and NMOS provided in the delay circuit unit 110. By controlling the number of PMOS and NMOS, the examples are able to control the time of the PMOS MP3 and NMOS MN3 being turned-off variously. Of course, in this case, the PMOS and NMOS that are to be added at the delay circuit unit 110 are formed in such a way that their channel lengths are identical to the channel lengths for the existing PMOS and NMOS. In other case, the PMOS and NMOS that are to be added at the delay circuit unit 110 are formed in such a way that their channel lengths are greater than the channel lengths for the existing PMOS and NMOS. In other case, it is able to provide greater time delay between when the node N1 and the node N2 charge or discharge than in such a way that their channel lengths are identical to the channel lengths for the existing PMOS and NMOS. Choosing which of the metal-oxide-semiconductor (MOS) transistor to add is performed by considering all facts such as providing a required working speed and/or low power for the CMOS inverter circuit device 100.

Figure 5:
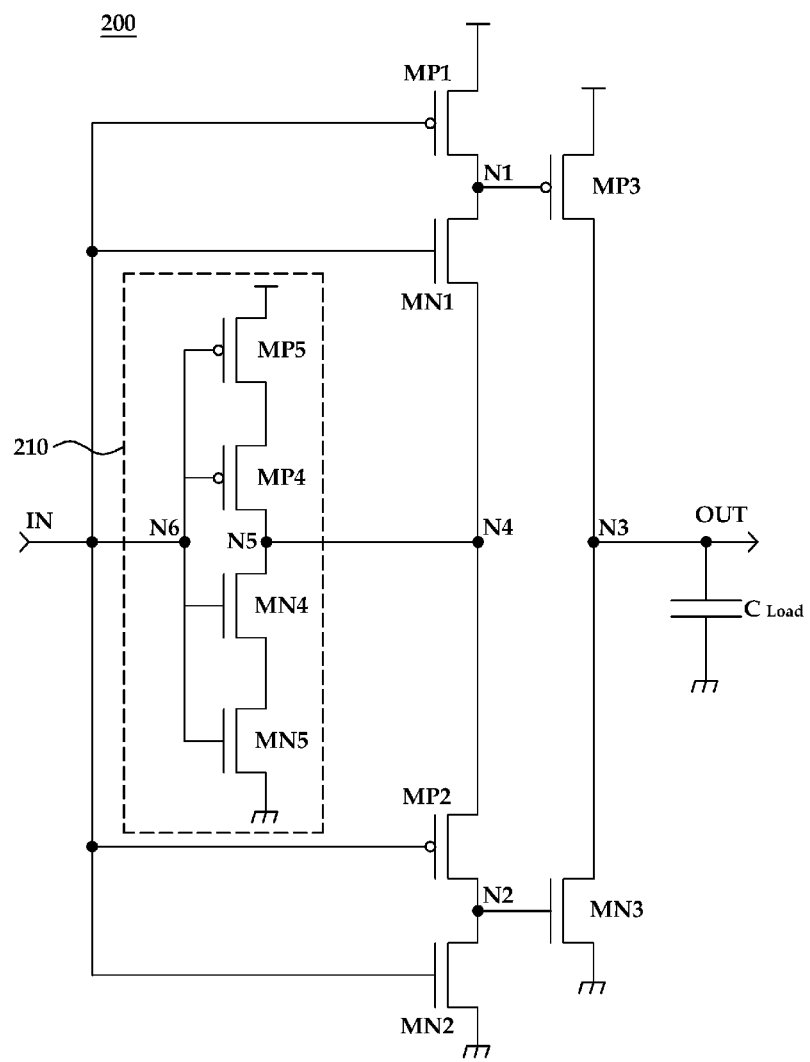
FIG. 5 is a schematic diagram illustrating a CMOS inverter circuit device according to a second example.

Another example of the present disclosure in accordance with the above is illustrated in FIG. 5. FIG. 5 is a schematic diagram illustrating a CMOS inverter circuit device according to a second example.

The second example is different from the first example merely in the number of PMOS and NMOS provided in the delay unit circuit 210 when comparing its architecture with the architecture of the first example described earlier. That is, in the example of FIG. 5, all architectures of the PMOS MP1 and MP2, the NMOS MN2 and MN1 connected with the input terminal, and the PMOS MP3 and NMOS MN3 of the output terminal are the same.

However, when considering the delay unit circuit 210 illustrated in FIG. 5, an architecture is provided, in which respectively the PMOS MP5 and NMOS MN5 are additionally connected to sources of the PMOS MP4 and NMOS MN4 connected in series. In the example of FIG. 5, the channel lengths of the PMOS MP5 and MOS MN5 are the same as those of the PMOS MP4 and NMOS MN4. However, it is not necessary that the channel lengths be identical. In other examples, the channel lengths differ from each other.

In this example, the time of charging for the nodes N1 and N2 is expressed as a representative equation of N1:N2=1:3 and the corresponding time of discharging is expressed as a representative equation of N2:N1=1:3. That is, the ratios between timing of charging and discharging between N1 and N2 is controllable as per the number of MOS units, numbering N that are added at the delay unit circuit 210.

Above, the second example has been presented as having the number of PMOS and NMOS being identical in the delay unit circuit 210. However, the present examples are not limited to such an architecture. In other examples, the charge time and discharge time are different by making the number of PMOS and NMOS different.

As discussed, the present examples delay a time for gate nodes of PMOS and NMOS located at an output terminal of a CMOS inverter when an input signal transitions. The examples also provide a time that the PMOS and NMOS are turned-off simultaneously by managing charge/discharge processes in a scheduled order and thereby minimize generation of a detrimental short circuit current.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A CMOS inverter circuit device, comprising:
   a first P-type metal-oxide-semiconductor (PMOS) transistor and a first N-type metal-oxide-semiconductor (NMOS) transistor, and a second PMOS transistor and a second NMOS transistor configured to:
   each receive an identical input signal through a gate terminal, and
   be connected in series respectively;
   a third PMOS transistor connected to a first node connected with drains of the first PMOS transistor and the first NMOS transistor;
   a third NMOS transistor connected to a second node connected with drains of the second PMOS transistor and the second NMOS transistor; and
   a delay circuit unit comprising:
   a fourth PMOS transistor and a fourth NMOS transistor configured to:
   each receive the input signal through a respective gate, and
   be connected in series in order for a fifth node connected with drains of the fourth PMOS transistor and the fourth NMOS transistor to be connected to a fourth node connected with a source of the first NMOS transistor and a source of the second PMOS transistor,
   wherein respective channel lengths of the first and second NMOS transistors are identical to each other such that the first and second NMOS transistors are turned on or off simultaneously, and
   wherein the fourth PMOS and fourth NMOS transistors of the delay circuit unit have channel lengths greater than channel lengths of the first, second, and third PMOS and NMOS transistors.

2. The CMOS inverter circuit device of claim 1,
   wherein the sources of the third PMOS transistor, the first PMOS transistor and the fourth PMOS transistor are connected to a power supply terminal, and
   wherein the sources of the third NMOS transistor, the second NMOS transistor, and the fourth NMOS transistor are connected to a ground terminal.

3. The CMOS inverter circuit device of claim 2,
   wherein a discharge path through the second NMOS transistor and a discharge path through the first NMOS transistor and the fourth NMOS transistor are generated when the input signal is at a high level.

4. The CMOS inverter circuit device of claim 3,
   wherein the second node is discharged and the first node is discharged.

5. The CMOS inverter circuit device of claim 4,
   wherein the third PMOS transistor and the third NMOS transistor are maintained in a turned-off state until the second node is discharged and the first node is discharged.

6. The CMOS inverter circuit device of claim 2,
   wherein a charge path through the first PMOS transistor and a charge path through the fourth PMOS transistor and the second PMOS transistor are generated when the input signal is at a low level.

7. The CMOS inverter circuit device of claim 6,
   wherein the first node is charged and the second node is charged.

8. The CMOS inverter circuit device of claim 7,
   wherein the third PMOS transistor and the third NMOS transistor are maintained in a turned-off condition until the first node is charged and the second node is charged.

9. The CMOS inverter circuit device of claim 1,
   wherein the delay circuit unit further comprises a fifth PMOS transistor and a fifth NMOS transistor connected in series with the fourth PMOS transistor and the fourth NMOS transistor.

10. The CMOS inverter circuit device of claim 9,
    wherein channel lengths of the fifth PMOS and the fifth NMOS are the same as those of the fourth PMOS transistor and the fourth NMOS transistor.

11. The CMOS inverter circuit device of claim 9,
    wherein the channel lengths of the fifth PMOS and the fifth NMOS are different from those of the fourth PMOS transistor and the fourth NMOS transistor.

12. The CMOS inverter circuit device of claim 9,
    wherein charging and discharging durations for the first and second nodes are controlled based on the number of PMOS and NMOS transistors of the delay circuit unit.

13. A CMOS inverter circuit device, comprising:
    a first P-type metal-oxide-semiconductor (PMOS) transistor and a first N-type metal-oxide-semiconductor (NMOS) transistor, and a second PMOS transistor and a second NMOS transistor configured to:
    each receive an identical input signal through a gate terminal, and
    be connected in series respectively;
    a third PMOS transistor connected to a first node connected with drains of the first PMOS transistor and the first NMOS transistor;
    a third NMOS transistor connected to a second node connected with drains of the second PMOS transistor and the second NMOS transistor; and
    a delay circuit unit comprising:
    delay PMOS transistors and delay NMOS transistors configured to:
    each receive the input signal through a respective gate, and
    be connected in series in order for a fifth node connected with drains of the delay PMOS transistors and the delay NMOS transistors to be connected to a fourth node connected with a source of the first NMOS transistor and a source of the second PMOS transistor,
    wherein respective channel lengths of the first and second NMOS transistors are identical to each other such that the first and second NMOS transistors are turned on or off simultaneously, and
    wherein the delay PMOS and delay NMOS transistors of the delay circuit unit have channel lengths identical to or greater than channel lengths of the first, second, and third PMOS and NMOS transistors, and
    wherein the delay circuit unit is configured to generate a charge or discharge signal delay between the first node and the second node.

14. The CMOS inverter circuit device of 13,
    wherein charging and discharging durations for the first and second nodes are controlled based on the number of the delay PMOS transistors and the delay NMOS transistors of the delay circuit unit.

* * * * *